United States Patent
Gui et al.

(10) Patent No.: US 7,081,947 B2
(45) Date of Patent: Jul. 25, 2006

(54) LITHOGRAPHIC APPARATUS AND DEVICE MANUFACTURING METHOD

(75) Inventors: Cheng-Qun Gui, Best (NL); Pieter Willem Herman de Jager, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 57 days.

(21) Appl. No.: 10/788,024

(22) Filed: Feb. 27, 2004

(65) Prior Publication Data

US 2005/0190353 A1 Sep. 1, 2005

(51) Int. Cl.
*G03B 27/52* (2006.01)
*G03B 27/42* (2006.01)
*G03B 27/54* (2006.01)

(52) U.S. Cl. .............................. 355/55; 355/53; 355/67
(58) Field of Classification Search ................ 355/53, 355/67, 71, 77; 359/224, 290, 291, 572; 430/311, 396; 250/492.22
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,379,867 B1 * | 4/2002 | Mei et al. ................... | 430/296 |
| 6,424,404 B1 | 7/2002 | Johnson | |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 6,879,376 B1 * | 4/2005 | Case et al. ..................... | 355/53 |
| 6,897,941 B1 * | 5/2005 | Almogy ....................... | 355/67 |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| EP | 1 482 375 A2 | 12/2004 |
| FR | 2837937 | 10/2003 |
| WO | WO 98/33096 | 7/1998 |
| WO | WO 98/38597 | 9/1998 |
| WO | WO 03/040830 A2 | 5/2003 |

OTHER PUBLICATIONS

European Search Report for European Application No. 05251081.5 mailed on Jun. 27, 2005, 4 pages.
Dialog File 351, Derwent WPI English language abstract for FR 2837937.

* cited by examiner

*Primary Examiner*—Alan Mathews
(74) *Attorney, Agent, or Firm*—Sterne, Kessler, Goldstein & Fox P.L.L.C.

(57) ABSTRACT

An arrangement for adjusting the position on a substrate of a patterned beam generated by a light engine relative to the substrate. The arrangement moves an array of focusing elements, each of which focuses a portion of the patterned beam onto a point on the substrate, relative to an array of individually controllable elements to impart the pattern to the patterned beam.

23 Claims, 6 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning device, which is alternatively referred to as a mask or a reticle, may be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (e.g., photoresist or resist). Instead of a mask, the patterning device may comprise an array of individually controllable elements which serve to generate the circuit pattern.

In general, a single substrate will contain a network of adjacent target portions that are successively exposed. Known lithographic apparatus include steppers, in which each target portion is irradiated by exposing an entire pattern onto the target portion at one time, and scanners, in which each target portion is irradiated by scanning the pattern through the projection beam in a given direction (the "scanning"-direction), while synchronously scanning the substrate parallel or anti-parallel to this direction.

When producing a pattern on a substrate, it is necessary to ensure that the patterned beam of radiation is correctly aligned with the surface of the substrate onto which the pattern is to be produced. This may be necessary to ensure that separately generated portions of the pattern are correctly aligned relative to one another, such that the overall pattern produced is correct and does not have discontinuities at the boundaries between the portions. Alternatively, it may be necessary to ensure that a pattern produced on the substrate is correctly aligned with a pattern previously produced on the substrate, for example, with another layer in a device with a plurality of layers. Conventionally, this has been achieved by mounting the substrate on a substrate table, accurately measuring the position of the substrate relative to the substrate table and subsequently carefully controlling the position of the substrate table until the substrate is in the desired position.

SUMMARY OF THE INVENTION

Embodiments of the present invention provide a system that can correctly position a pattern produced on a substrate.

In one embodiment of the present invention, there is provided a lithographic apparatus including an illumination system for supplying a projection beam of radiation, an array of individually controllable elements serving to impart the projection beam with a pattern in its cross-section, a substrate table for supporting a substrate, and a projection system for projecting the patterned beam onto a target portion of the substrate. The projection system includes an array of focusing elements, each for projecting part of the patterned beam onto part of the target portion of the substrate. The apparatus further includes an actuator system for moving the array of focusing elements relative to the array of individually controllable elements.

Consequently, the position of the pattern exposed on the substrate can be adjusted without moving the substrate. This may be useful, for example, in the manufacture of flat panel displays. In that case, the substrate may be very large, for example two meters by two meters. Such a size of substrate may make it difficult to accurately position the substrate. Furthermore, especially with large substrates, while it may be possible to accurately position the substrate as a whole, this may not result in accurate positioning of the target portion of the substrate on which the patterned beam is to be projected. For example, thermal expansion of the substrate may result in significant movement of the target portion of the substrate relative to an edge that may be used for setting the position of the substrate as a whole. In this case, movement of the array of focusing elements to adjust the position of the patterned beam may be used as a fine positioning method to compensate for such inaccuracies in the positioning of the substrate or part thereof.

The actuator system may be arranged to move the array of focusing elements relative to the array of individually controllable elements in at least one of the following: (1) in a first direction, substantially parallel to the face of the substrate on which the patterned beam is incident; (2) in a second direction, perpendicular to the first direction and substantially parallel to the face of the substrate on which the patterned beam is incident; (3) in a third direction, substantially perpendicular to the face of the substrate on which the pattern beam is incident; and (4) rotationally about one or more axes, substantially parallel to the first, second and third directions.

By use of these adjustments, as appropriate, it is possible to compensate not only for positional errors of the target portion of the substrate relative to the substrate table, for example, but also for any local deformations of the substrate. Such deformation may result in, for example, the target portion of the substrate being out of the plane of the remainder of the substrate (i.e. displaced in a direction perpendicular to the plane of the substrate) or at an angle to it. Therefore, with the present invention, improved imaging of the pattern onto the substrate may be achieved if the substrate is not perfectly flat without requiring movement of the substrate itself.

The array of focusing elements may include a radiation blocking layer that is disposed between the focusing elements and prevents radiation within the patterned beam which is not incident on any one of the focusing elements from reaching the substrate. Consequently, when the array of focusing elements is moved relative to the array of individually controllable elements, radiation from one or more of the individually controllable elements associated with a first focusing element in the array of focusing elements will not be incident on another one of the focusing elements and hence will not be projected onto a different part of the target portion of the substrate than was intended. Thus, so-called "ghosting" will be reduced or prevented. Furthermore, the radiation directed onto the aperture associated with each focusing element may overfill the aperture. Accordingly as the array of focusing elements is moved, each aperture in the radiation blocking layer remains filled. Therefore, the intensity of the radiation directed to the substrate does not change due to the movement of the array of focusing elements. The radiation blocking layer may, for example, be formed from chromium.

The apparatus may include a second array of individually controllable elements for imparting a second projection beam with a pattern in its cross-section and a second projection system, including a second array of focusing elements, for projecting the second patterned beam onto a second target portion of the substrate. In this case, the actuator system for moving the first array of focusing elements may be arranged to move the first array of focusing elements relative to the second array of focusing elements. Consequently, it is possible simultaneously to use two separate patterning systems, so-called "light engines," each comprising an array of individually controllable elements for patterning a projection beam and associated projection system, and be able to adjust the relative position of the two patterned beams incident on the substrate. Thus, it is possible to ensure that the exposures generated by each of the arrays of individually controllable elements are correctly aligned with respect to one another and that there are no discontinuities in the overall pattern, for example, at the boundaries.

A second actuator system may be provided for moving the second array of focusing elements relative to the second array of individually controllable elements. Consequently, it is possible to ensure that both patterned beams are correctly aligned with the respective portions of the substrate on which they are incident as well as relative to each other.

If required, many more arrays of individually controllable elements, each with an associated projection system containing an array of focusing elements and an associated actuator system for controlling the position of the array of focusing elements relative to the array of individually controllable elements may be used. Thus, it is possible to project a plurality of patterned beams onto a substrate simultaneously while controlling the relative positions of the patterned beams. Preferably, each of the actuator systems is able to adjust the position of the associated array of focusing elements in the same manner as referred to above for the first actuators (i.e., in up to six degrees of freedom).

The apparatus may include a reference frame to which the actuator systems are mounted so that they can move the associated arrays of focusing elements relative to the reference frame. Thus, by knowing the position of the substrate or a portion thereof relative to the reference frame, it is possible to control the positions of each of the arrays of focusing elements relative to the substrate.

The arrays of individually controllable elements and/or the elements of the projection systems other than the arrays of focusing elements may also be fixed to the reference frame such that movement of the arrays of focusing elements relative to the reference frame is the same as movement of the arrays of focusing elements relative to the arrays of individually controllable elements.

Another embodiment of the present invention provides a device manufacturing method including the steps of providing a substrate, providing a projection beam of radiation using an illumination system, using an array of individually controllable elements to impart the projection beam with a pattern in its cross-section, and projecting the patterned beam of radiation onto a target portion of the substrate using a projection system that includes an array of focusing elements, each for projecting part of the patterned beam onto part of the target portion of the substrate. The position of the array of focusing elements is adjusted relative to the array of individually controllable elements.

A further embodiment of the present invention provides a lithographic apparatus including an illumination system for supplying a projection beam of radiation, an array of individually controllable elements serving to impart the projection beam with a pattern in its cross-section, a substrate table for supporting a substrate, a projection system for projecting the patterned beam onto a target portion of the substrate, a second array of individually controllable elements serving to impart a second projection beam with a pattern in its cross-section, and a second projection system for projecting the second patterned beam onto a second target portion of the substrate. The position of the first array of individually controllable elements is fixed relative to the position of the first projection system, the position of the second array of individually controllable elements is fixed relative to the position of the second projection system, and the apparatus includes an actuator system for moving the first array of individually controllable elements and first projection system relative to the second array of individually controllable elements and second projection system.

Accordingly, one can use a plurality of light engines, each comprising an array of individually controllable elements and an associated projection system, to project a plurality of patterned beams to expose a substrate and can adjust the relative position of the patterned beams. In particular, such an arrangement can also be used for apparatus in which the projection system does not include an array of focusing elements as in the first embodiment.

Preferably, the actuator system can be arranged to move the first light engine relative to the second light engine in at least one of the following: (1) in a first direction, substantially parallel to the face of the substrate on which the patterned beams are incident; (2) in a second direction, perpendicular to the first direction and substantially parallel to the face of the substrate on which the patterned beams are incident; (3) in a third direction, substantially perpendicular to the face of the substrate on which the patterned beams are incident; and (4) rotationally about one or more axes substantially parallel to the first, second and third directions. Accordingly, it is possible to ensure that the patterned beams each correctly position and align with the respective portion of the substrate on which they are incident, even if there are local deformations in the substrate.

Each of the light engines (namely the array of individually controllable elements and the associated projection system) may include a reference frame to which the components of that light engine are mounted such that their relative positions are fixed. In this case, the actuator system may be mounted to act between these reference frames in order to control the relative positions of the light engines.

The apparatus may include an additional reference frame to which the substrate table is mounted. The reference frame associated with each of the light engines may then be mounted to the additional reference frame such that the positions of the light engine reference frames relative to the additional reference frame are controlled by the associated actuator systems. Accordingly, the positions of the light engines relative to the substrate table, and hence to the substrate thereon, can be controlled by the associated actuator systems.

A still further embodiment of the present invention provides a method including the steps of providing a substrate, providing a projection beam of radiation using an illumination system, using an array of individually controllable elements to impart the projection beam with a pattern in its cross-section, projecting the patterned beam of radiation onto a target portion of the substrate, providing a second projection beam of radiation, using a second array of individually controllable elements to impart the second projection beam with a pattern in its cross-section, projecting the second patterned beam onto a second target portion of the substrate, using an actuator system to control the position of the first array of individually controllable elements and a projection system that is used to project the first patterned beam onto the substrate, relative to the second array of individually controllable elements and a second projection system that is used to project the second patterned beam onto the substrate.

BRIEF DESCRIPTION OF THE FIGURES/DRAWINGS

The accompanying drawings, which are incorporated herein and form a part of the specification, illustrate the present invention and, together with the description, further serve to explain the principles of the invention and to enable a person skilled in the pertinent art to make and use the invention.

Figure 1:
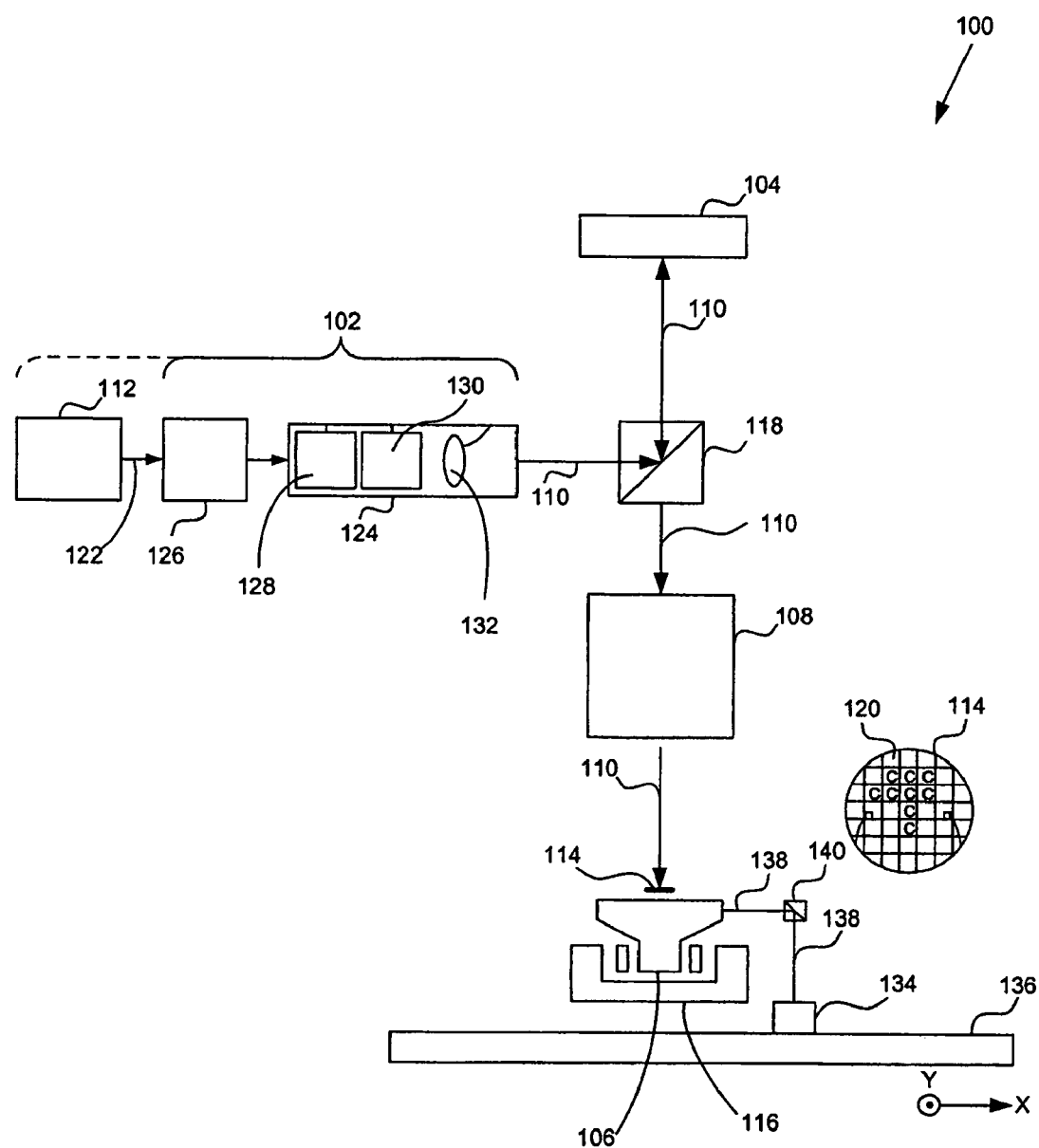
FIG. 1 depicts a lithographic apparatus according to an embodiment of the invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview and Terminology

The term "array of individually controllable elements" as here employed should be broadly interpreted as referring to any means that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning means may include the following.

A programmable mirror array. This may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical Micro Electro-Mechanical Systems (MEMS) devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described above, the array of individually controllable elements can comprise one or more programmable mirror arrays.

More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum.

Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Lithographic Projection Apparatus

FIG. 1 schematically depicts a lithographic projection apparatus 100 according to an embodiment of the invention. Apparatus 100 includes at least a radiation system 102 (e.g., EX, IL (e.g., AM, IN, CO, etc.) etc.), an array of individually controllable elements PPM 104, an object table WT 106 (e.g., a substrate table), and a projection system ("lens") PL 108.

Radiation system 102 can be used for supplying a projection beam PB 110 of radiation (e.g., UV radiation), which in this particular case also comprises a radiation source LA 112.

Array of individually controllable elements 114 (e.g., a programmable mirror array) can be used for applying a pattern to the projection beam 110. In general, the position of the array of individually controllable elements 114 can be fixed relative to projection system 108. However, in an alternative arrangement, an array of individually controllable elements 114 may be connected to a positioning device (not shown) for accurately positioning it with respect to projection system 108. As here depicted, individually controllable elements 114 are of a reflective type (e.g., have a reflective array of individually controllable elements).

Object table 106 can be provided with a substrate holder (not specifically shown) for holding a substrate W 114 (e.g., a resist-coated silicon wafer or glass substrate) and object table 106 can be connected to positioning device PW 116 for accurately positioning substrate 114 with respect to projection system 108.

Projection system (e.g., a lens) 108 (e.g., a quartz and/or $CaF_2$ lens system or a catadioptric system comprising lens elements made from such materials, or a mirror system) can be used for projecting the patterned beam received from beam splitter 118 onto a target portion C 120 (e.g., one or more dies) of the substrate 114. The projection system 108 may project an image of the array of individually controllable elements 114 onto the substrate 114. Alternatively, the projection system 108 may project images of secondary sources for which the elements of the array of individually controllable elements 114 act as shutters. The projection system 108 may also comprise a micro lens array (MLA) to form the secondary sources and to project microspots onto the substrate 114.

The source 112 (e.g., an excimer laser) can produce a beam of radiation 122. This beam 122 is fed into an illumination system (illuminator) IL 124, either directly or after having traversed conditioning device 126, such as a beam expander Ex, for example. The illuminator 124 may comprise adjusting device AM 128 for setting the outer and/or inner radial extent (commonly referred to as σ-outer and σ-inner, respectively) of the intensity distribution in the beam 122. In addition, it will generally comprise various other components, such as an integrator IN 130 and a condenser CO 132. In this way, the beam 110 impinging on the array of individually controllable elements 114 has a desired uniformity and intensity distribution in its cross-section.

It should be noted, with regard to FIG. 1, that the source 112 may be within the housing of the lithographic projection apparatus 100 (as is often the case when the source 112 is a mercury lamp, for example). In alternative embodiments, source 112 may also be remote from the lithographic projection apparatus 100. In this case, radiation beam 122 would be led into the apparatus 100 (e.g., with the aid of suitable directing mirrors). This latter scenario is often the case when the source 112 is an excimer laser. It is to be appreciated that both of these scenarios are contemplated within the scope of the present invention.

The beam 110 subsequently intercepts the array of individually controllable elements 114 after being directing using beam splitter 118. Having been reflected by the array of individually controllable elements 114, the beam 110 passes through the projection system 108, which focuses the beam 110 onto a target portion 120 of the substrate 114.

With the aid of the positioning device 116 (and optionally interferometric measuring device IF 134 on base plate BP 136 that receives interferometric beams 138 via beam splitter 140), the substrate table 106 can be moved accurately, so as to position different target portions 120 in the path of the beam 110. Where used, the positioning device for the array of individually controllable elements 114 can be used to accurately correct the position of the array of individually controllable elements 114 with respect to the path of the beam 110, e.g., during a scan. In general, movement of the object table 106 is realized with the aid of a long-stroke module (course positioning) and a short-stroke module (fine positioning), which are not explicitly depicted in FIG. 1. A similar system may also be used to position the array of individually controllable elements 114. It will be appreciated that the projection beam 110 may alternatively/additionally be moveable while the object table 106 and/or the array of individually controllable elements 114 may have a fixed position to provide the required relative movement.

In an alternative configuration of the embodiment, the substrate table 106 may be fixed, with the substrate 114 being moveable over the substrate table 106. Where this is done, the substrate table 106 is provided with a multitude of openings on a flat uppermost surface, gas being fed through the openings to provide a gas cushion which is capable of supporting the substrate 114. This is conventionally referred to as an air bearing arrangement. The substrate 114 is moved over the substrate table 106 using one or more actuators (not shown), which are capable of accurately positioning the substrate 114 with respect to the path of the beam 110. Alternatively, the substrate 114 may be moved over the substrate table 106 by selectively starting and stopping the passage of gas through the openings.

Although the lithography apparatus 100 according to the invention is herein described as being for exposing a resist on a substrate, it will be appreciated that the invention is not limited to this use and the apparatus 100 may be used to project a patterned projection beam 110 for use in resistless lithography.

The depicted apparatus 100 can be used in four preferred modes:

1. Step mode: the entire pattern on the array of individually controllable elements 114 is projected in one go (i.e., a single "flash") onto a target portion 120. The substrate table 106 is then moved in the x and/or y directions to a different position for a different target portion 120 to be irradiated by the beam 110.

2. Scan mode: essentially the same as step mode, except that a given target portion 120 is not exposed in a single "flash." Instead, the array of individually controllable elements 114 is movable in a given direction (the so-called "scan direction", e.g., the y direction) with a speed v, so that the projection beam 110 is caused to scan over the array of individually controllable elements 114. Concurrently, the substrate table 106 is simultaneously moved in the same or opposite direction at a speed V=Mv, in which M is the magnification of the projection system 108. In this manner, a relatively large target portion 120 can be exposed, without having to compromise on resolution.

3. Pulse mode: the array of individually controllable elements 114 is kept essentially stationary and the entire pattern is projected onto a target portion 120 of the substrate 114 using a pulsed radiation system 102. The substrate table 106 is moved with an essentially constant speed such that the projection beam 110 is caused to scan a line across the substrate 106. The pattern on the array of individually controllable elements 114 is updated as required between pulses of the radiation system 102 and the pulses are timed such that successive target portions 120 are exposed at the required locations on the substrate 114. Consequently, the projection beam 110 can scan across the substrate 114 to expose the complete pattern for a strip of the substrate 114. The process is repeated until the complete substrate 114 has been exposed line by line.

4. Continuous scan mode: essentially the same as pulse mode except that a substantially constant radiation system 102 is used and the pattern on the array of individually controllable elements 114 is updated as the projection beam 110 scans across the substrate 114 and exposes it.

Combinations and/or variations on the above described modes of use or entirely different modes of use may also be employed.

Exemplary Light Engine(s)

Figure 2:
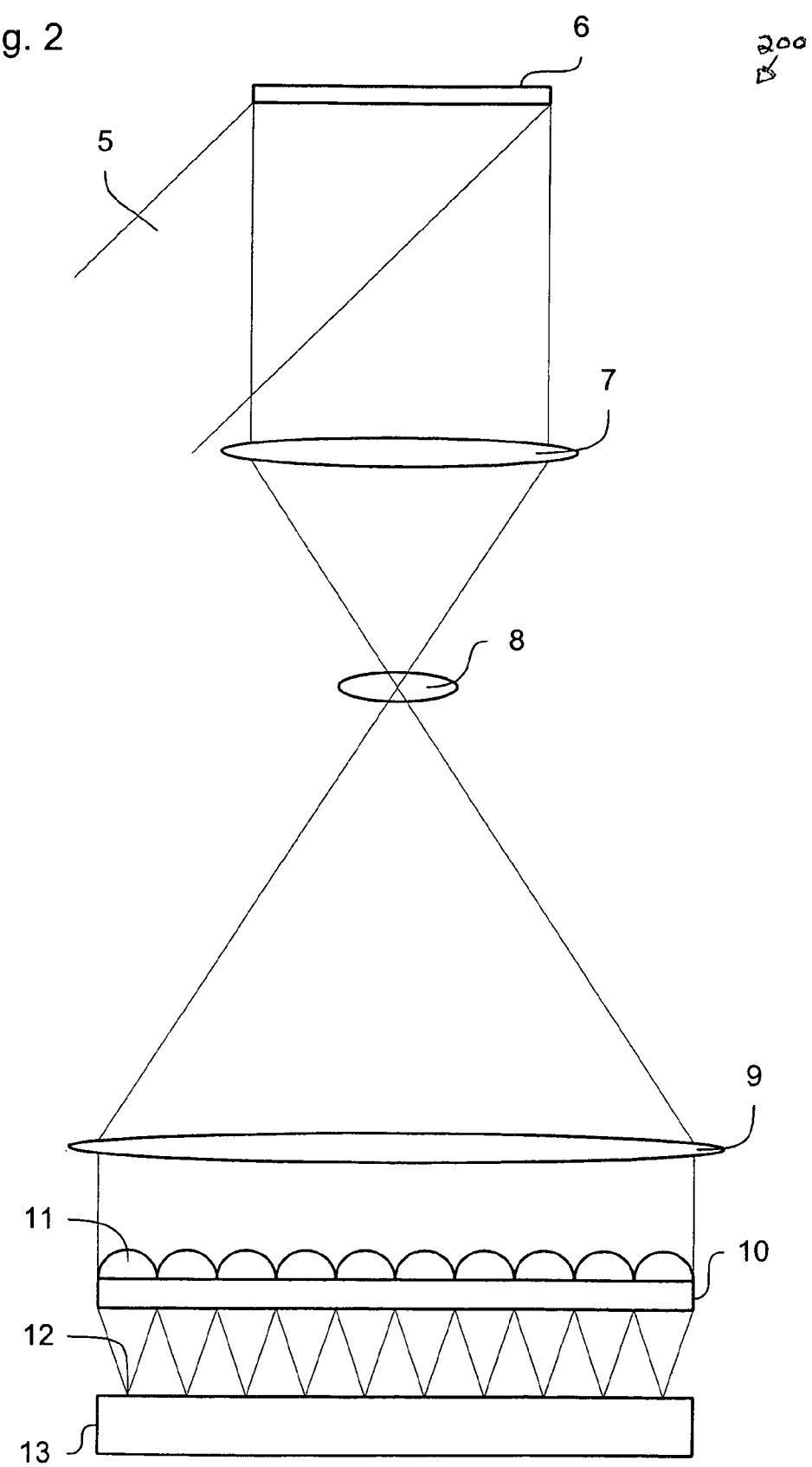
FIG. 2 depicts, in more detail, a portion of a lithographic apparatus used to illuminate a portion of a substrate.

FIG. 2 shows a "light engine" 200 according to an embodiment of the present invention. Light engine 200 can be used to pattern a beam of radiation 5 and project it onto a substrate 13. Beam of radiation 5 is incident on an array of individually controllable elements 6. Beam of radiation 5 subsequently has a pattern imparted to its cross-section, and is then directed to a projection system that can project the patterned beam onto substrate 13. In this embodiment of the present invention, the projection system includes an array 10 of focusing elements 11. Each focusing element 11 in array 10 projects part of the patterned beam onto a point 12 on substrate 13. Focusing elements 11 can be lenses.

For example, an array of 1024×768 lenses may be used. Lenses 11 are typically relatively small, and consequently the array 10 of focusing elements 11 is frequently referred to as a micro lens array (MLA). In practice, the micro lenses 11 may be formed on a substrate side of micro lens array 10. This provides a free working distance, typically, of from about a few hundreds of microns to about a few millimeters.

The projection system may also include additional elements, for example lenses 7, 8, and 9, for magnifying, shaping, focusing or otherwise controlling the patterned beam.

Figure 3:
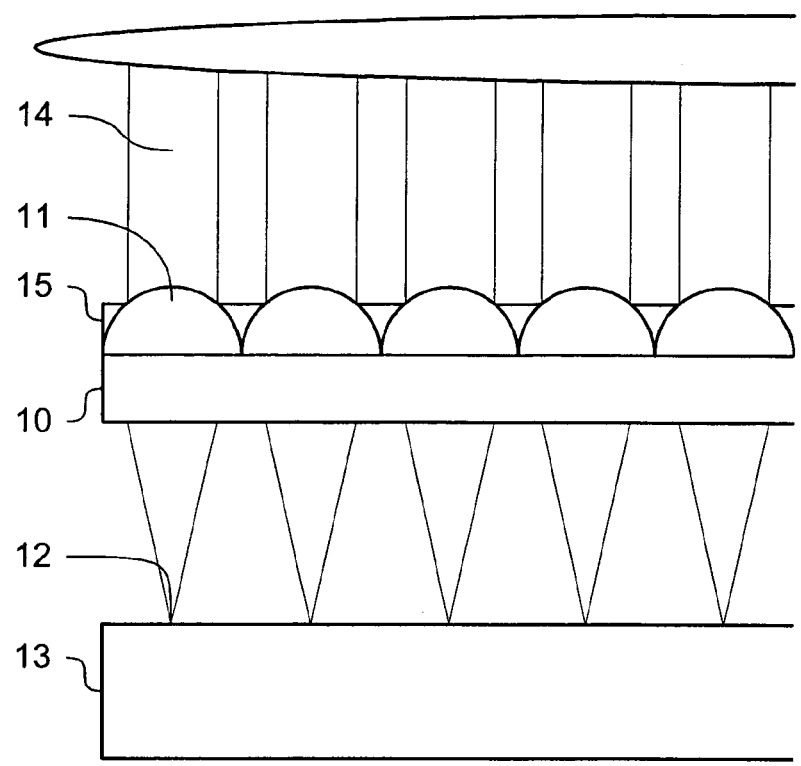
FIG. 3 depicts a portion of the apparatus shown in FIG. 2 in further detail.

FIG. 3 shows a portion of array 10 of focusing elements 11 in greater detail, according to an embodiment of the present invention. Array 10 preferably includes a radiation blocking layer 15 arranged between each adjacent focusing element 11. Consequently, only portion 14 of the patterned beam that is incident on focusing element 11 passes through array 10 to be focused on associated point 12 on substrate 13. The remainder of the radiation, that is incident on radiation blocking layer 15, is prevented from reaching the substrate. Apertures in radiation blocking layer 15 may be overfilled. In other words, the patterned radiation directed onto each focusing element 11 may be incident not only on focusing element 11, but also on radiation blocking layer 15 that is surrounding it. Therefore, when array 10 of focusing elements 11 is moved, the entirety of a focusing element 11 is still illuminated. In turn, this ensures that the intensity of the radiation at point 12 on substrate 13 to which the radiation is focused does not change as a result of the array 10 of focusing elements 11 being moved.

Figure 4:
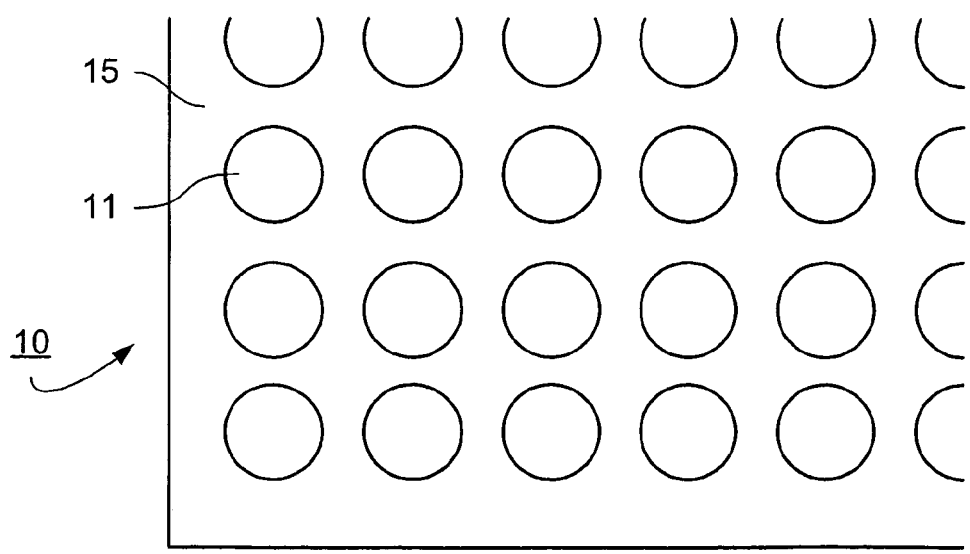
FIG. 4 depicts, in plan view, a portion of the apparatus shown in FIG. 3.

FIG. 4 shows a plan view of a portion of array 10 of focusing elements 11, according to an embodiment of the present invention. Radiation blocking layer 15 and a plurality of the focusing elements 11 are shown. The radiation blocking layer 15 may, preferably, be formed from chromium.

The size of radiation blocking layer 15 is a proportion of the area of array 10 of focusing elements 11, which is preferably kept as small as possible to minimize the amount of radiation absorbed by array 10 of the focusing elements 11. Anti-reflection layers may be used on focusing elements 11 and/or radiation blocking layer 15 in order to reduce stray reflections of radiation within the apparatus. The incident radiation may cause heating of array 10 of focusing elements 11. A cooling system (not show) may therefore be provided to ensure that any consequent temperature rises do not result in loss of position accuracy of array 10 of focusing elements 11, or part thereof, due to thermal expansion. Preferably the cooling system may be temperature controlled.

Figure 5A:
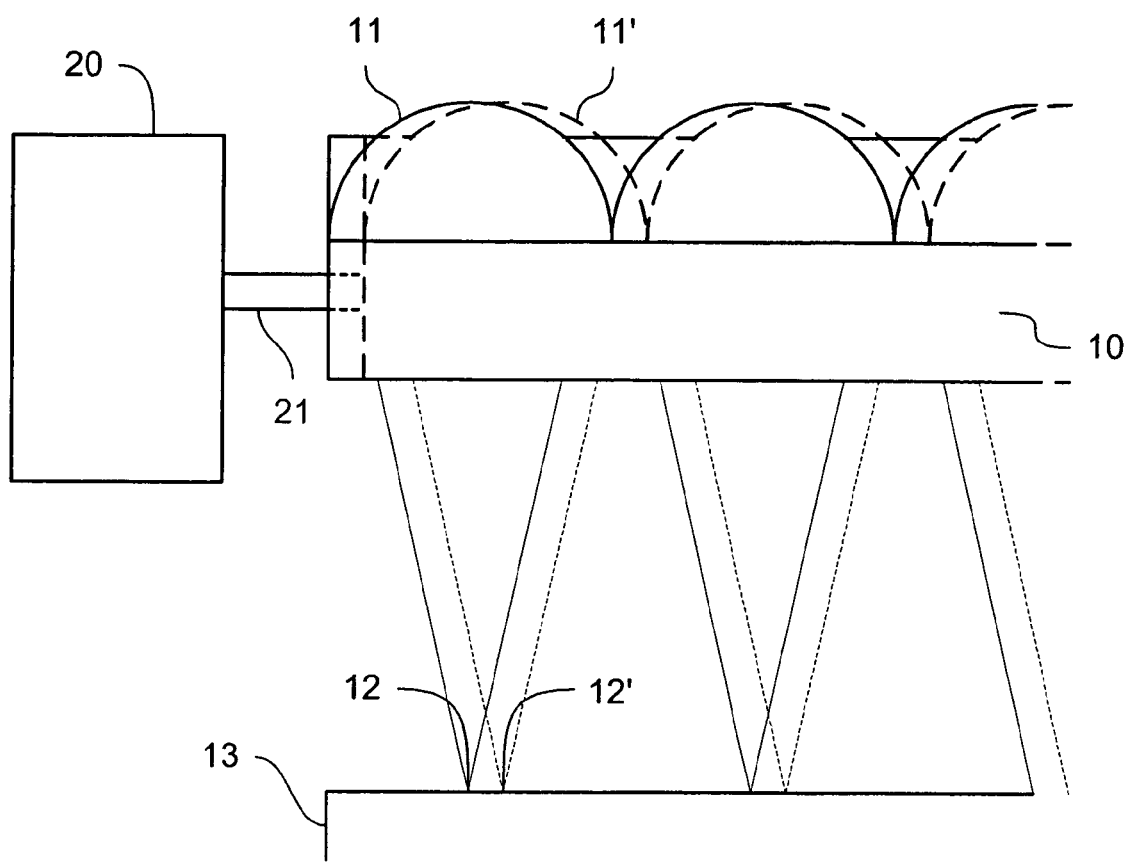
FIGS. 5a and 5b depict different possible positions of a portion of the apparatus shown in FIG. 3 when in use.
Figure 5B:
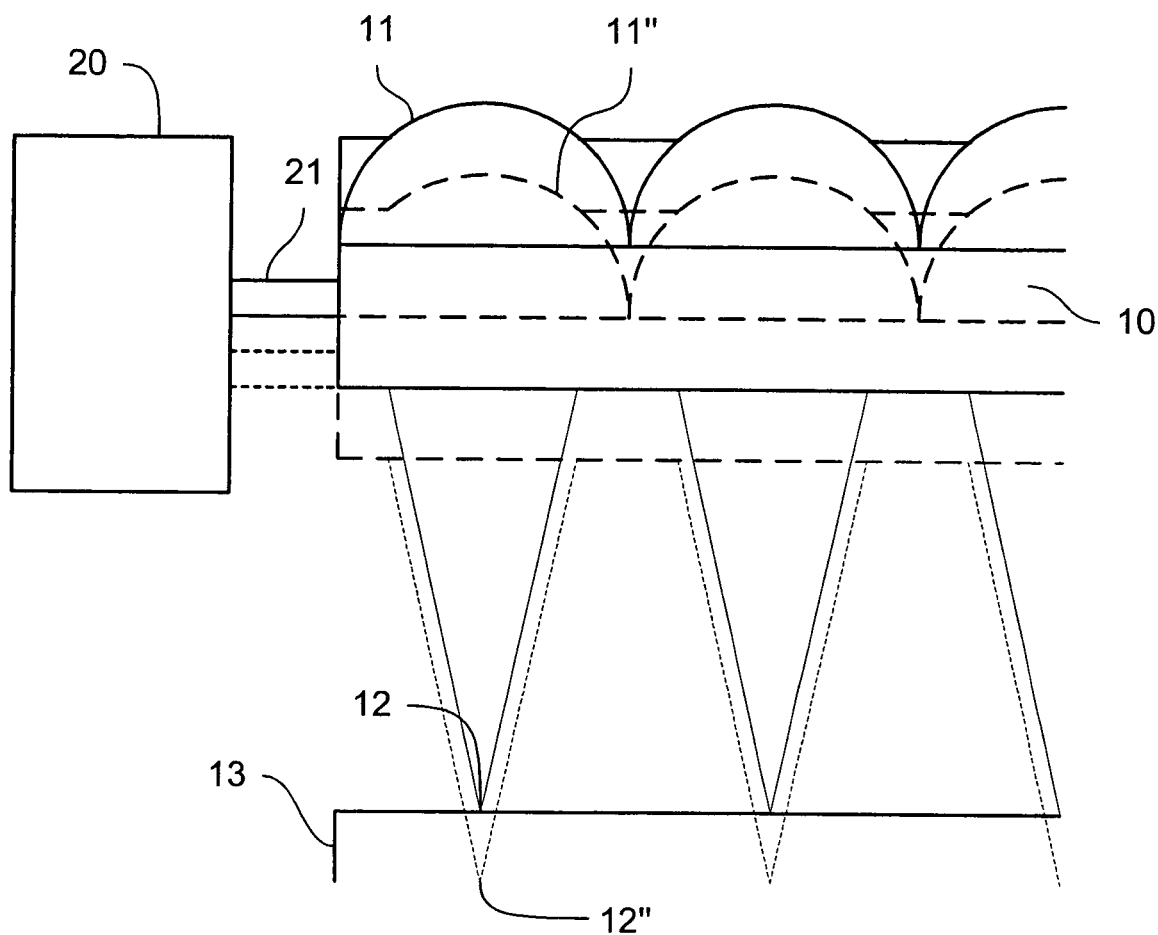

As shown in FIGS. 5a and 5b, array 10 can be connected to an actuator system 20, which can control its position.

As shown in FIG. 5a, the array 10 of focusing elements 11 may be moved within a plane that is parallel to the surface of substrate 13 on which the patterned beam is incident. As each focusing element 11 is moved to a new position 11', point 12 of substrate 13 on which the corresponding portion of the patterned beam is focused also moves to a new position 12'. Therefore, by shifting array 10 of focusing elements 11, it is possible to move the position of the patterned beam relative to substrate 13 without moving substrate 13 or array of individually controllable elements 6.

As shown in FIG. 5b, array 10 of focusing elements 11 can also be moved in a direction perpendicular to the face of substrate 13 on which the patterned beam is incident. This can be done to compensate for variations of the position of the surface of substrate 13 in this direction.

It will be appreciated that by rotating array 10 of focusing elements 11 the patterned beam that is incident on substrate 13 may be correspondingly rotated, for example to compensate for distortions on the surface of substrate 13. In general, therefore, actuator system 20 may be arranged to control the position of array 10 in up to 6 degrees of freedom, namely linearly in two orthogonal directions that are parallel to the substrate on which the patterned beam is to be incident and in a third linear direction perpendicular to the surface of the substrate on which the patterned beam is incident and, rotationally, about three axes, parallel to the three linear directions. It will be further appreciated, however, that in some circumstances it may be sufficient to control the position of array 10 in fewer degrees of freedom, for example only in the two linear directions parallel to the surface of the substrate.

Actuator system 20 may be connected to array 10 via a linkage 21 as shown in FIGS. 5*a* and 5*b*. Accordingly, actuator 20 can be physically separated from the part of the apparatus in which substrate 13 is illuminated in order to prevent any contaminants from actuator system 20 from reaching substrate 13.

Alternatively, actuator system 20 may be mounted directly to array 10. Actuator system 20 may include a plurality of actuators, such as, for example, voice coil actuators, Lorentz actuators, piezo-electric actuators, or other known actuators. Furthermore, one or more actuators may be dedicated to adjusting the position of array 10 in a given direction or individual actuators may be included in the control of the movement of array 10 in a plurality of directions.

First Exemplary Environment

Figure 6:
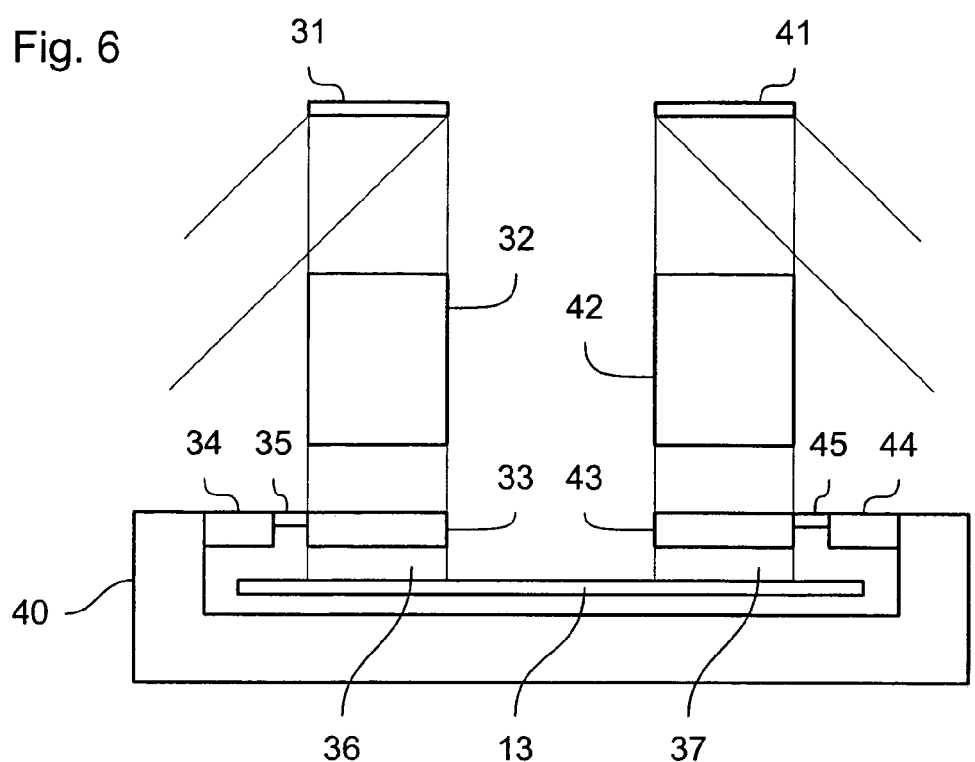
FIG. 6 depicts an additional aspect of the present invention.

FIG. 6 shows an embodiment in which the apparatus may include a plurality of light engines. In this embodiment, the apparatus can have first and second light engines including first and second arrays of individually controllable elements 31,41, first and second lens systems 32,42, first and second array of focusing elements 33,43 and first and second actuator systems 34,44 connected to the arrays of focusing elements by linkages 35,45. The apparatus can include a reference frame 40 to which both actuator systems 34,44 are mounted. Accordingly, each actuator system 34,44 is arranged to control the position of its associated array of focusing elements 33,43 relative to reference frame 40. Thus, the position of each of the arrays 33,43 may easily be controlled relative to one another, and hence, the relative positions of the associated patterned beams projected onto the substrate 13 can be controlled.

It will be appreciated that the reference frame 40 may have other configurations that shown in FIG. 6. For example, the reference frame 40 may be a plate to which arrays 33,43 are mounted together with their associated actuator systems 34,44. Such a plate may, for example, be part of the projection system.

The reference frame 40 can preferably be made from a material with a low coefficient of thermal expansion, such as Zerodure, to ensure that the position of the arrays 33,43 do not move relative to one another, in use, due to any heating of the apparatus. Alternatively/additionally a cooling system (not shown) may be included in the reference frame in order to reduce/eliminate such thermal effects. Preferably, the cooling system is temperature controlled.

Depending on the configuration of reference frame 40, additional components may be mounted to the reference frame 40 so that their position relative to the position of arrays 33,43 is also known. The components include a substrate table for supporting substrate 13, measuring systems for measuring the position of substrate 13 or measuring position of part of substrate 13, measuring systems for confirming the positions of the arrays of focusing elements 33,43, the components of the projection system other than arrays of focusing elements 33,43 and/or arrays of individually controllable elements. It will be appreciated that where these elements are mounted to reference frame 40, the mounting may be adjustable, such that the mounting position can be measured and adjusted if required.

Alignment features (also referred to as reference marks) may be located on arrays 33,43 and/or on reference frame 40 to assist in measuring the positions of the components of the apparatus.

The reference frame 40 on which arrays 33,43 are mounted may in turn be mounted on a base frame (not shown) of the apparatus. In this configuration, an additional actuator system (not shown) may be provided for controlling the position of reference frame 40 supporting arrays 33,43 relative to the base frame. In this way, the general position of all of arrays 33,43 relative to other components of the apparatus may be controlled using the additional actuator system and the position of the individual arrays of focusing elements 33,43 relative to one another using actuator systems 34,44 associated with each array 33,43.

As discussed above, the positions of arrays 33,43, and hence the patterned beams may be adjusted in response to surface deformations of substrate 13 and/or thermal expansion of substrate 13. Therefore, actuation systems 34,44 may be controlled in response to measurements of substrate 13 made before the exposure process begins. For example, a surface topography of substrate 13 may be mapped prior to exposure and this data used for controlling the positions of arrays 33,43 during the exposure process. Alternatively or additionally, the apparatus may include sensors (not shown) for inspecting substrate 13 during the exposure process. For example, the sensors can be used for measuring the local position of substrate 13 and/or local alignment marks on a given portion of substrate 13 immediately prior to that portion of substrate 13 passing under the patterned beams. This allows corrections to be made on-the-fly and it is thus possible compensate for any changes to substrate 13 or deformations that occur during the exposure process.

The system may be calibrated by exposing a characteristic pattern, known as a focus energy matrix (FEM) on substrate 13 at a plurality of positions of each of arrays of focusing elements 33,43 relative to the associated arrays of individually controllable elements 31,41. Substrate 13 can then be developed and inspected to identify the resulting positions of the patterned beam.

Alternatively, a camera (not shown) may be mounted on the substrate table and arranged to measure directly the position of the patterned beams as actuator systems 34,44 adjust the positions of arrays 33,43. This information may be used to calibrate actuator system such that it can make minor adjustments to the position of the arrays 34,44 during an exposure sequence to compensate for any surface deformations of substrate 13. The system may also be used, if required, to measure and to compensate for any changes in intensity of the patterned beam caused by part of it being blocked by a radiation blocking layer (not shown) when an array 33,43 is moved relative to an array of individually controllable elements 31,41.

Alternatively, the calibration may be merely used to provide sufficiently accurate relative alignment and/or positioning of each of arrays of focusing elements 33,43 which are then fixed in position for the duration of an exposure sequence. For example, the light engines may be mounted such that the distance between the arrays of spots projected onto substrate 13 by each light engine (each spot being the portion of the patterned beam that is focused onto a single place by one of focusing elements 33,43) is a given multiple of the pitch of the spot matrix (namely the distance between each adjacent spot produced by a single light engine).

The position placement accuracy of arrays of focusing elements 33,43 is typically required to be such that the accuracy of the distance between the arrays of spots projected onto substrate 13 by the light engines is a fraction of the pitch of the spot matrix. For example, it may be less than a half of the pitch of the spot matrix.

The actuator system may only be able to adjust the position of arrays 33,43 by a small distance relative to the pitch of the spot matrix. It may, for example, have a stroke only capable of moving the patterned beam on the substrate by an amount equivalent to a few times the pitch of the spot matrix. In this case, if the relative position of two of the light engines needs correcting by a larger amount than the stroke of the actuator system 34,44, part of the position compensation may be effected by shifting the pattern electronically on the array of individually controllable elements 31,41.

It will be appreciated that while the description above has only referred to two light engines, in practice the lithographic apparatus may contain many more light engines used in conjunction. For example, it may contain twenty or more light engines. Each light engine may therefore be associated with its own actuator system for adjusting the position of its array of focusing elements, and hence the patterned beam that it produces on the substrate relative to the other light engines and relative to the substrate, in a manner corresponding to the previous description.

Second Exemplary Environment

Figure 7:
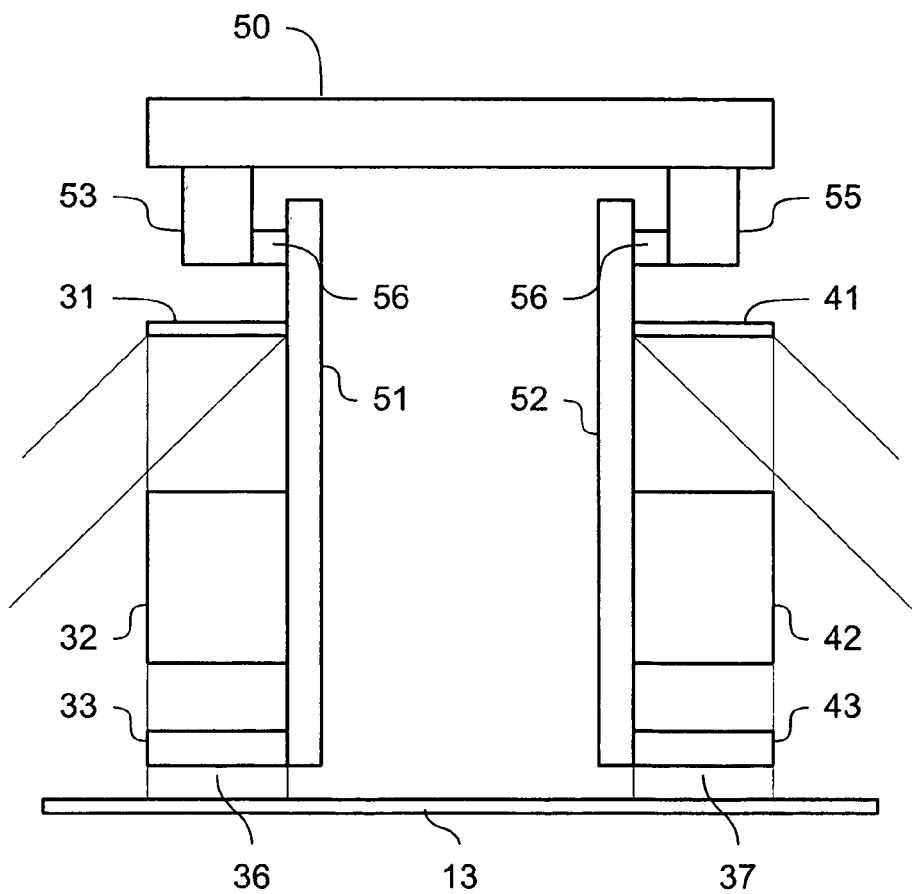
FIG. 7 depicts a second embodiment of the present invention.

FIG. 7 shows a system according to another embodiment of the present invention. As shown, the system includes two light engines, each including an array of individually controllable elements 31,41, a beam shaping and controlling unit 32,42, and an array of focusing elements 33,43. However, the apparatus of the second embodiment differs from that of the embodiment of FIG. 6 in that the position of array of focusing elements 33, 43 relative to position of the array of individually controllable elements 31, 41 within each light engine is fixed. In particular, as shown, each light engine may include an associated frame 51,52 to which at least array of focusing elements 33,43 and array of individually controllable elements 31,41 are fixed.

In this configuration, adjusting the relative positions of light engine reference frames 51,52 can also adjust the relative positions of patterned beams 36,37 projected by each onto substrate 13. An additional reference frame 50 may be provided to which each of the light engine reference frames are mounted by means of an associated actuator system 53,55 and, if required, associated link 54,56.

Similar to as discussed above with reference to FIG. 6, additional components of the apparatus, such as the substrate table for supporting substrate 13 and/or measuring systems may be mounted to the additional reference frame 50. Alternatively, an additional actuator system may be used to mount the additional reference frame 50 to a base frame of the apparatus such that the position of all of the light engines relative to the remainder of the apparatus can be simultaneously adjusted by means of the additional actuator system, but control of the position of each of the light engines relative to the others may be effected by means of their associated actuator system.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a projection beam of radiation;
   an array of individually controllable elements serving to impart the projection beam with a pattern in its cross-section;
   a substrate table that supports a substrate;
   a projection system that projects the patterned beam onto a target portion of the substrate, the projection system including an array of focusing elements located in a plane, each of the focusing elements projecting part of the patterned beam onto part of the target portion of the substrate; and
   an actuator system that moves the array of focusing elements through one or more planes parallel to the plane and in a direction substantially perpendicular to a face of the substrate on which the patterned beam is incident.

2. The lithographic apparatus according to claim 1, wherein the array of focusing elements includes a radiation blocking layer located between the focusing elements, the radiation blocking layer preventing radiation within the patterned beam that is not incident on the focusing elements from reaching the substrate.

3. The lithographic apparatus according to claim 1, wherein the apparatus further comprises:
   a second array of individually controllable elements serving to impart a second projection beam with a pattern in its cross-section; and
   a second projection system that projects the second patterned beam onto a second target portion of the substrate, the second projection system including a second array of focusing elements,
   wherein each of the second array of focusing elements projects part of the second patterned beam onto part of the second target portion of the substrate,
   wherein the actuator system that moves the first array of focusing elements also moves the first array of focusing elements relative to the second array of focusing elements.

4. The lithographic apparatus according to claim 3, wherein the apparatus further comprises:
   a second actuator system for moving the second array of focusing elements relative to the second array of individually controllable elements.

5. The lithographic apparatus according to claim 4, wherein the second array of focusing elements move relative to the second array of individually controllable elements in at least one of a first direction substantially parallel to the face of the substrate on which the second patterned beam is incident, a second direction perpendicular to the first direction and substantially parallel to the face of the substrate on which the second patterned beam is incident, a third direction substantially perpendicular to the face of the substrate on which the second patterned beam is incident, and rotationally about one or more axes substantially parallel to the first, second and third directions.

6. The lithographic apparatus according to claim 4, wherein the apparatus further comprises:
a reference frame; and
first and second actuator systems that are mounted to the reference frame, such that the first and second actuator systems move the first and second arrays of focusing elements, respectively, relative to the reference frame.

7. The lithographic apparatus according to claim 6, wherein the first and second arrays of individually controllable elements are mounted to the reference frame.

8. The lithographic apparatus according to claim 6, wherein the elements of the first and second projection systems, other than the arrays of focusing elements, are mounted to the reference frame.

9. The lithography apparatus of claim 1, wherein the array of focusing elements further moves relative to the array of individually controllable elements in at least one of: (a) a first direction substantially parallel to the face of the substrate on which the patterned beam is incident, (b) a second direction perpendicular to the first direction and substantially parallel to the face of the substrate on which the patterned beam is incident, and (c) rotationally about one or more axes substantially parallel to the first, second and third directions.

10. A lithographic apparatus comprising:
an illumination system that supplies a projection beam of radiation;
an array of individually controllable elements serving to impart the projection beam with a pattern in its cross-section;
a substrate table that supports a substrate;
a projection system that projects the patterned beam onto a target portion of the substrate;
a second array of individually controllable elements serving to impart a second projection beam with a pattern in its cross-section;
a second projection system that projects the second patterned beam onto a second target portion of the substrate; and
an actuator system for moving the first array of individually controllable elements and the first projection system relative to the second array of individually controllable elements and the second projection system,
wherein the position of the first array of individually controllable elements is fixed relative to the position of the first projection system,
wherein the position of the second array of individually controllable elements is fixed relative to the position of the second projection system.

11. The lithographic apparatus according to claim 10, wherein the first array of individually controllable elements and the first projection system move relative to the second array of individually controllable elements and second projection system in at least one of a first direction substantially parallel to the face of the substrate on which the patterned beams are incident, a second direction perpendicular to the first direction and substantially parallel to the face of the substrate on which the patterned beams are incident, a third direction, substantially perpendicular to the face of the substrate on which the patterned beams are incident, and rotationally about one or more axes substantially parallel to the first, second and third directions.

12. The lithographic apparatus according to claim 10, further comprising:
a first reference frame, wherein the first array of individually controllable elements and the first projection system are fixed to the first reference frame; and
a second reference frame, wherein the second array of individually controllable elements and the second projection system are fixed to the second reference frame, wherein the actuator system is mounted to operate between the first and second reference frames.

13. The lithographic apparatus according to claim 12, further comprising:
a third reference frame to which the substrate table is mounted, wherein the first reference frame is mounted to the third reference frame and wherein the first actuator system controls the relative positions of the first and third reference frames; and
a second actuator system, wherein the second reference frame is mounted to the third reference frame and wherein the second actuator system controls the relative positions of the second and third reference frames.

14. A device manufacturing method, comprising:
using an array of individually controllable elements to pattern a beam;
projecting the patterned beam onto a target portion of a substrate using a projection system, the projection system including an array of focusing elements located in a plane parallel to a face of the substrate on which the patterned beam is incident;
using each of the focusing elements to project part of the patterned beam onto part of the target portion of the substrate; and
adjusting the position of the array of focusing elements relative to the array of individually controllable elements through one or more planes parallel to the plane and in a direction substantially perpendicular to the face of the substrate on which the patterned beam is incident.

15. The method of claim 14, further comprising:
adjusting the array of focusing element relative to the array of individually controllable element in at least one of: moves relative to the array of individually controllable elements in at least one of: (a) a first direction substantially parallel to the face of the substrate on which the patterned beam is incident, (b) a second direction perpendicular to the first direction and substantially parallel to the face of the substrate on which the patterned beam is incident, and (c) rotationally about one or more axes substantially parallel to the first, second and third directions.

16. A device manufacturing method, comprising:
providing a substrate;
providing a projection beam of radiation using an illumination system;
using an array of individually controllable elements to impart the projection beam with a pattern in its cross-section; and
projecting the patterned beam of radiation onto a target portion of the substrate,
providing a second projection beam of radiation;
using a second array of individually controllable elements to impart the second projection beam with a pattern in its cross-section;
projecting the second patterned beam onto a second target portion of the substrate;

using an actuator system to control the position of the first array of individually controllable elements and a first projection system relative to the second array of individually controllable elements and a second projection system;

using the first projection system to project the first patterned beam onto the substrate; and using the second projection system to project the second patterned beam onto the substrate.

17. A lithographic apparatus, comprising:

an illumination system that supplies a beam of radiation;

a plurality of patterning devices that pattern respective portions of the beam;

a plurality of projection systems corresponding to the plurality of patterning devices, each projection system of the plurality of projection systems including an array of focusing elements that projects the respective patterned portions of the beam onto corresponding target portions of a substrate; and an actuator system that moves each of the array of focusing elements relative to a corresponding one of the patterning devices in the plurality of patterning devices.

18. The lithographic apparatus according to claim 17, wherein each of the arrays of focusing elements include a radiation blocking layer, each respective one of the radiation blocking layers preventing radiation within the respective patterned portions of the beam that is not incident on the respective focusing elements from reaching the substrate.

19. The lithographic apparatus according to claim 17, wherein each of the arrays of focusing elements moves relative to respective ones of the plurality of patterning devices in any one of the following manners:

(a) a first direction substantially parallel to the face of the substrate on which the second patterned beam is incident;

(b) a second direction perpendicular to the first direction and substantially parallel to the face of the substrate on which the second patterned beam is incident;

(c) a third direction substantially perpendicular to the face of the substrate on which the second patterned beam is incident; or (d) rotationally about one or more axes substantially parallel to the first, second and third directions.

20. The lithographic apparatus according to claim 17, further comprising:

a reference frame; and a plurality of actuator systems coupled to the reference frame, such that each respective actuator system moves a respective one of the arrays of focusing elements relative to the reference frame.

21. The lithographic apparatus according to claim 20, wherein the plurality of patterning devices are coupled to the reference frame.

22. A device manufacturing method, comprising:

patterning respective portions of a beam of radiation with respective patterning devices in an array of patterning devices;

projecting the respective patterned portions of the beam onto respective target portions of a substrate using corresponding projection systems in an array of projection systems, each of the projection systems including an array of focusing elements;

projecting part of the respective patterned portions of the beam onto the respective target portions with each of the focusing elements in each respective one of the array of focusing elements; and adjusting the position of each of the array of focusing elements relative to a corresponding one of the patterning devices.

23. The device manufacturing method of claim 22, wherein the adjusting step further comprises moving the focusing elements relative to the corresponding one of the patterning devices in one of the following manners:

(a) a first direction substantially parallel to the face of the substrate on which the patterned beam is incident;

(b) a second direction perpendicular to the first direction and substantially parallel to the face of the substrate on which the patterned beam is incident;

(c) a third direction substantially perpendicular to the face of the substrate on which the patterned beam is incident; or (d) rotationally about one or more axes substantially parallel to the first, second and third directions.

* * * * *